United States Patent
Bitsch et al.

(10) Patent No.: US 8,421,443 B2
(45) Date of Patent: Apr. 16, 2013

(54) BRANCH CURRENT MONITOR WITH CALIBRATION

(75) Inventors: Michael Bitsch, Hillsboro, OR (US);
Martin Cook, Tigard, OR (US);
Matthew Rupert, Amity, OR (US)

(73) Assignee: Veris Industries, LLC, Tualatin, OR (US)

( * ) Notice: Subject to any disclaimer, the term of this patent is extended or adjusted under 35 U.S.C. 154(b) by 296 days.

(21) Appl. No.: 12/592,211

(22) Filed: Nov. 20, 2009

(65) Prior Publication Data

US 2010/0207604 A1    Aug. 19, 2010

Related U.S. Application Data

(60) Provisional application No. 61/199,912, filed on Nov. 21, 2008.

(51) Int. Cl.
*G01R 15/18* (2006.01)
(52) U.S. Cl.
USPC .................. 324/127; 324/117 R; 324/140 R
(58) Field of Classification Search ............. 324/117 R, 324/126, 127, 140 T–142, 706, 764.01, 648
See application file for complete search history.

(56) References Cited

U.S. PATENT DOCUMENTS

| | | | |
|---|---|---|---|
| 1,100,171 A | 6/1914 | Brown | |
| 1,455,263 A | 5/1923 | Oberfell | |
| 1,569,723 A | 1/1926 | Dickinson | |
| 1,800,474 A | 4/1931 | Scherer | |
| 1,830,541 A | 11/1931 | Harris | |
| 1,871,710 A | 8/1932 | Lenehan | |
| 2,059,594 A | 11/1936 | Massa, Jr. | |
| 2,412,782 A | 12/1946 | Palmer | |
| 2,428,613 A | 10/1947 | Boyajian | |
| 2,663,190 A | 12/1953 | Ilgenfritz | |
| 2,746,295 A | 5/1956 | Lubkin | |
| 2,802,182 A | 8/1957 | Godshalk et al. | |
| 2,852,739 A | 9/1958 | Hansen | |
| 2,943,488 A | 7/1960 | Strobel et al. | |
| 3,190,122 A | 6/1965 | Edwards | |
| 3,243,674 A | 3/1966 | Ebert | |
| 3,287,974 A | 11/1966 | Ciemochowski | |
| 3,374,434 A | 3/1968 | Perry | |
| 3,493,760 A | 2/1970 | Hoadley | |
| 3,512,045 A | 5/1970 | Sanger et al. | |
| 3,584,294 A | 6/1971 | Siwko | |

(Continued)

FOREIGN PATENT DOCUMENTS

EP    1531334 A2    5/2005
JP    5083776    4/1993

OTHER PUBLICATIONS

AT91M42800A Summary, "AT91 ARM Thumb Microcontrollers," Atmel, Feb. 2002.
Description of KT® 6300, 6400 Split-Core kW/kWH Transducers . . . Enercept KT®, Veris Industries, Inc., (date unavailable).

(Continued)

*Primary Examiner* — Joshua Benitez Rosario
(74) *Attorney, Agent, or Firm* — Chernoff Vilhauer McClung & Stenzel, LLP

(57) ABSTRACT

A meter for measuring electric power consumed by a plurality of branch circuits includes interchangeable current transformers including respective transformer memories for storage of transformer characterization data and enables self-discovery of a phase shift induced by respective current transformers and the phase of current conducted by each branch circuit.

12 Claims, 9 Drawing Sheets

U.S. PATENT DOCUMENTS

| | | |
|---|---|---|
| 3,593,078 A | 7/1971 | Domshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 4,001,647 A | 1/1977 | Klein et al. |
| 4,001,758 A | 1/1977 | Esper et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Milkovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,890,318 A | 12/1989 | Crane et al. |
| 4,926,105 A | 5/1990 | Mischenko et al. |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Boutellier |
| 5,099,193 A | 3/1992 | Moseley et al. |
| 5,122,735 A | 6/1992 | Porter et al. |
| 5,148,348 A | 9/1992 | White |
| 5,181,026 A | 1/1993 | Granville |
| 5,196,784 A | 3/1993 | Estes, Jr. |
| D335,488 S | 5/1993 | Suzuki et al. |
| 5,223,790 A | 6/1993 | Baran et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah et al. |
| 5,365,462 A | 11/1994 | McBean |
| 5,377,128 A | 12/1994 | McBean |
| D354,945 S | 1/1995 | Dellavecchia et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Perelle |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr et al. |
| 5,753,983 A | 5/1998 | Dickie et al. |
| 5,784,249 A | 7/1998 | Pouliot |
| 5,808,846 A | 9/1998 | Holce et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | Mcintyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |
| 5,995,911 A | 11/1999 | Hart |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A | 5/2000 | Redmyer |
| 6,091,023 A | 7/2000 | O'Donnell |
| 6,122,972 A | 9/2000 | Crider |
| 6,124,791 A | 9/2000 | Wolf |
| D431,534 S | 10/2000 | Holce et al. |
| 6,133,709 A | 10/2000 | Puchianu |
| 6,133,723 A | 10/2000 | Feight |
| 6,137,418 A | 10/2000 | Zuercher et al. |
| 6,146,109 A | 11/2000 | Davis et al. |
| 6,236,949 B1 | 5/2001 | Hart |
| 6,269,317 B1 | 7/2001 | Schachner et al. |
| 6,308,140 B1 | 10/2001 | Dowling et al. |
| 6,330,516 B1 | 12/2001 | Kammeter |
| 6,331,821 B1 | 12/2001 | Holce et al. |

| Patent | Date | Inventor |
|---|---|---|
| 6,344,951 B1 | 2/2002 | Sato et al. |
| 6,351,206 B1 | 2/2002 | Schweiger et al. |
| 6,373,238 B2 | 4/2002 | Lewis et al. |
| 6,377,430 B2 | 4/2002 | Holce et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | O'Donnell |
| D466,078 S | 11/2002 | Bowman |
| 6,496,378 B2 | 12/2002 | Holce et al. |
| 6,504,357 B1 | 1/2003 | Hemminger et al. |
| 6,504,695 B1 | 1/2003 | Holce et al. |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,657,424 B1 | 12/2003 | Voisine et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 | 10/2004 | Bruno et al. |
| 6,815,942 B2 | 11/2004 | Randall et al. |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,888,712 B2 | 5/2005 | Holce et al. |
| 6,889,271 B1 | 5/2005 | Germer et al. |
| 6,937,003 B2 | 8/2005 | Bowman et al. |
| 6,950,292 B2 | 9/2005 | Holce et al. |
| 6,988,043 B1 | 1/2006 | Randall |
| 7,006,934 B2 | 2/2006 | Jonker et al. |
| 7,053,497 B2 | 5/2006 | Sodemann et al. |
| 7,157,899 B2 | 1/2007 | Bruno |
| 7,161,345 B2 | 1/2007 | Bruno |
| 7,193,428 B1 | 3/2007 | Baron et al. |
| 7,212,930 B2 | 5/2007 | Bruno |
| 7,221,145 B2 * | 5/2007 | Bowman et al. ............. 324/142 |
| 7,230,414 B2 | 6/2007 | Bruno |
| 7,239,810 B2 | 7/2007 | Seely et al. |
| 7,274,187 B2 | 9/2007 | Loy |
| 7,282,889 B2 | 10/2007 | Freed et al. |
| 7,310,049 B2 | 12/2007 | Bowman |
| 7,312,686 B2 | 12/2007 | Bruno |
| 7,330,022 B2 | 2/2008 | Bowman et al. |
| 7,333,345 B2 | 2/2008 | Holce et al. |
| 7,352,287 B2 | 4/2008 | Rupert |
| 7,359,809 B2 | 4/2008 | Bruno |
| 7,447,603 B2 | 11/2008 | Bruno |
| 7,453,267 B2 * | 11/2008 | Westbrock et al. ........... 324/522 |
| 7,474,088 B2 * | 1/2009 | Bowman et al. .............. 324/142 |
| 7,652,871 B2 * | 1/2010 | Caggiano et al. ............. 361/652 |
| 8,085,055 B2 * | 12/2011 | Rupert .......................... 324/706 |
| 8,193,803 B2 * | 6/2012 | Bose et al. ................. 324/117 H |
| 8,212,548 B2 * | 7/2012 | Parker et al. .............. 324/140 R |
| 8,212,549 B2 * | 7/2012 | McNulty et al. .............. 324/141 |
| 8,294,453 B2 * | 10/2012 | Bowman ....................... 324/127 |
| 2001/0040446 A1 * | 11/2001 | Lapinksi et al. .............. 324/126 |
| 2004/0227503 A1 | 11/2004 | Bowman et al. |
| 2005/0240362 A1 | 10/2005 | Randall |
| 2006/0085144 A1 | 4/2006 | Slota et al. |
| 2006/0103548 A1 | 5/2006 | Borkowski et al. |
| 2006/0164096 A1 | 7/2006 | Kwon |
| 2006/0181242 A1 | 8/2006 | Freed et al. |
| 2006/0238932 A1 * | 10/2006 | Westbrock et al. ............. 361/42 |
| 2007/0153438 A1 * | 7/2007 | Caggiano et al. ............... 361/62 |
| 2008/0303511 A1 * | 12/2008 | Grno ........................ 324/117 R |
| 2009/0115400 A1 | 5/2009 | Hunter |
| 2009/0115620 A1 | 5/2009 | Hunter et al. |
| 2009/0295370 A1 | 12/2009 | Parker et al. |
| 2010/0176960 A1 * | 7/2010 | Bitsch et al. .................. 340/664 |
| 2010/0235122 A1 * | 9/2010 | McCrea et al. ................. 702/64 |
| 2010/0308792 A1 * | 12/2010 | Rupert et al. .............. 324/76.77 |
| 2011/0098985 A1 * | 4/2011 | Lawson ........................... 703/1 |

OTHER PUBLICATIONS

Ganssle, "Interrupt Latency," Oct. 1, 2001, [online], [retrieved on Aug. 26, 2004], Retrieved from the Embedded.com website using the Internet, <URL: http://www.embedded.com/showArticle.jhtml?articleID=9900320 >.

* cited by examiner

BRANCH CURRENT MONITOR WITH CALIBRATION

CROSS-REFERENCE TO RELATED APPLICATIONS

This application claims the benefit of U.S. Provisional App. No. 61/199,912, filed Nov. 21, 2008.

BACKGROUND OF THE INVENTION

The present invention relates to a metering system and, more particularly, to a modular meter for measuring electricity consumption by a plurality of loads.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, typically a power meter capable of monitoring a plurality of circuits is installed proximate the power distribution panel to provide centralized monitoring of the various loads powered from the panel.

Flexibility has favored adoption of digital power meters incorporating data processing systems that can monitor a plurality of circuits and determine a number of parameters related to electricity consumption. A digital power meter for measuring electricity consumption by respective branch circuits comprises a plurality of voltage and current transducers that are periodically read by a data processing unit which, in a typical digital power meter, comprises one or more microprocessors or digital signal processors (DSP). The data processing unit periodically reads and stores the outputs of the transducers quantifying the magnitudes of current and voltage samples and, using that data, calculates the current, voltage, power, and other electrical parameters, such as active power, apparent power and reactive power, that quantify electricity distribution and consumption. The calculated parameters are typically output to a display for immediate viewing or transmitted from the meter's communications interface to another data processing system, such as a building management computer for remote display or further processing, for example formulating instructions to automated building equipment.

The voltage transducers of digital power meters commonly comprise a voltage divider network that is connected to a conductor in which the voltage will be measured. The power distribution panel provides a convenient location for connecting the voltage transducers because typically each phase of the power is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be interconnected anywhere in the wiring that connects the supply and a load, including at the load's terminals.

The current transducers of digital power meters typically comprise current transformers that encircle the respective power cables that connect each branch circuit to the bus bar(s) of the distribution panel. A current transformer typically comprises multiple turns of wire wrapped around the cross-section of a toroidal core. The power cable conducting the load current is passed through the aperture in the center of the toroidal core and constitutes the primary winding of the transformer and the wire wrapped around the cross-section of the core comprises the secondary winding of the transformer. Current flowing in the primary winding (primary current) induces a secondary voltage and current in the secondary winding which is quantitatively related to the current in the primary winding. The secondary winding is typically connected to a resistor network and the magnitude of the primary current can be determined from the amplitude of the voltage at the output of the resistor network. To measure the power consumed by a plurality of loads making up a facility, a current transformer must be installed encircling each conductor in which the current will be measured. Bowman et al., U.S. Pat. No. 6,937,003 B2, discloses a power monitoring system that includes a plurality of current transformers mounted on a common support facilitating installation of a power meter in an electrical distribution panel.

Accurate measurement of electric power also requires compensation for error introduced by the transducers comprising the power meter. For example, the secondary current of a current transformer is ideally equal to the load current in the power cable (the primary winding) divided by the number of turns in the secondary winding. However, magnetization of the core of the transformer produces ratio and phase errors which may vary with the magnitude of the current being measured and the configuration of the particular transformer, including factors such as core material and turns ratio. Typically, error compensation factors are ascertained by experimentation with sample transformers of each production batch and the compensation factors for correcting the calculated output of the meter are stored in a memory in the power meter for use by the data processing unit during calculation of the meter's output.

While initial installation of a power meter at the distribution panel is simplified by integrating a plurality of current transformers into a single assembly, field repairs, modifications and updating of the power meter or the facility's circuitry can be problematic. A power meter is calibrated with a specific set of current and voltage transducers and modification of a meter or replacement of a failed transducer requires recalibration of the meter. A field repairperson typically does not have the equipment necessary to recalibrate the power meter and store new error correction data or a revised transducer configuration in the power meter's memory. As a result, it may be necessary to install a new, calibrated meter or accept inaccurate readings from a meter that has been altered by repair.

What is desired, therefore, is a electricity meter providing flexible construction, simplified installation and improved serviceability.

DETAILED DESCRIPTION OF PREFERRED EMBODIMENTS

Figure 1:
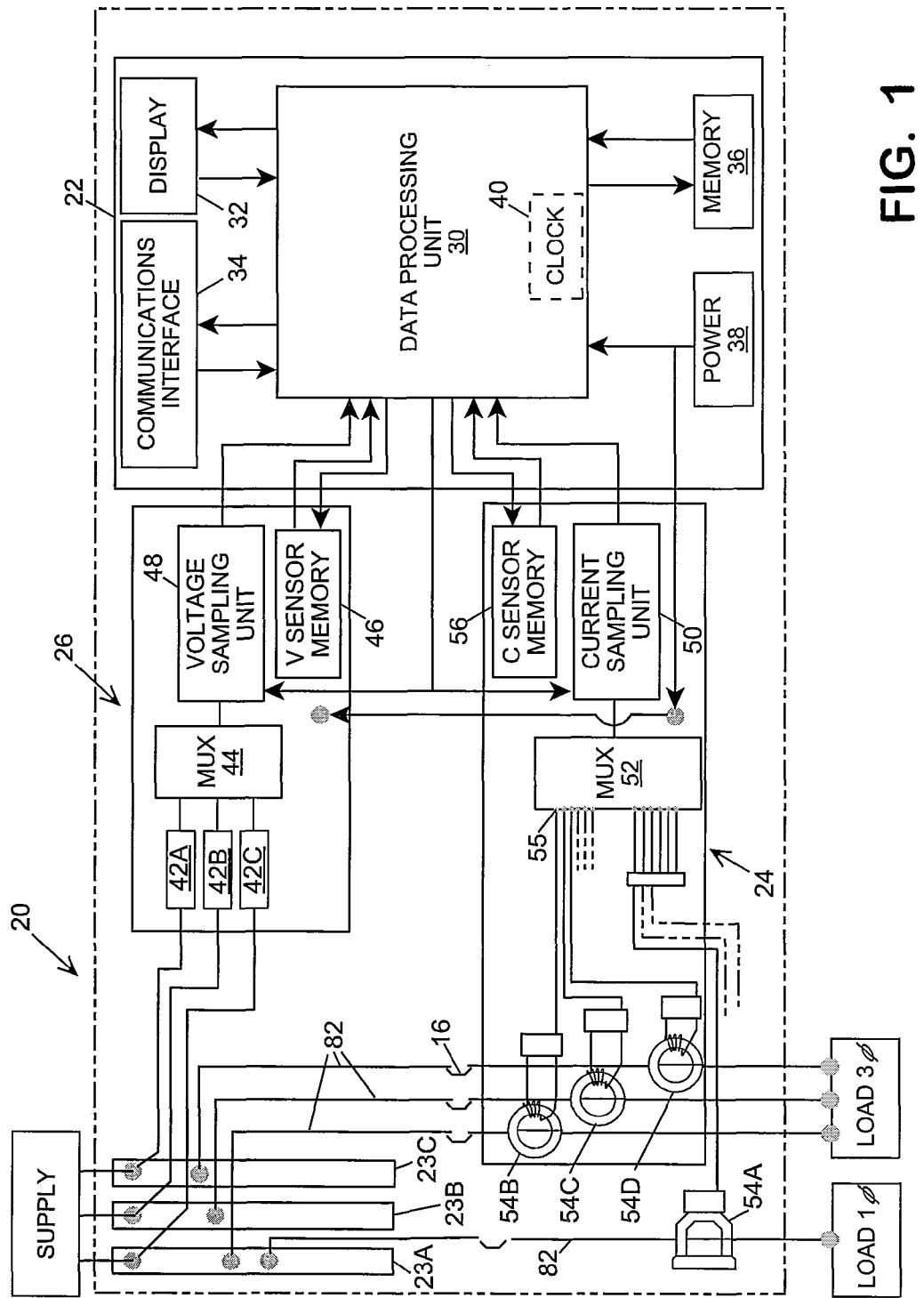
FIG. 1 is a schematic diagram of a digital power meter.

Referring in detail to the drawings where similar parts are identified by like reference numerals, and, more particularly to FIG. 1, a digital power meter 20 arranged to monitor the voltage and current in a plurality of branch circuits comprises, generally, a data processing module 22, a current module 24 and a voltage module 26. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The calculated values may be output to a display 32 for viewing at the meter or output to a communications interface 34 for transmission to another data processing system, such as a building management computer, for remote display or use in automating or managing facility functions. The data processing module may also include a memory 36 in which the software for the data processing unit and the data manipulated by the data processing unit may be stored. In addition, the data processing module may include a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and covert the analog measurements to digital data suitable for use by the data processing unit and a multiplexer 44 that periodically connects the voltage sampling unit to selected ones of the voltage transducers enabling periodic sampling of the magnitude of the voltage. Typically, each phase of the electricity supplied to a distribution panel is connected to a bus bar 23 to which is connected the circuit breakers 16 that provide a conductive interconnection to each of the loads. Since the voltage and phase supplied to all commonly connected loads is the same, a meter for measuring three-phase power typically includes three voltage transducers 42A, 42B, 42C each connected to a respective bus bar 23A, 23B, 23C. The voltage module also includes a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for sensors of the new module can be connected to the data processing unit. The data processing unit reads the data contained in the voltage sensor memory and applies the sensor characterization data when calculating the voltage from the output data of the replacement voltage module.

The current module 24 typically comprises a current sampling unit 50, a multiplexer 52 and a plurality of current transducers 54 communicatively connected to respective sensor positions 55 of current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. A clock 40, which may be included in the data processing unit, provides a periodic timing signal to the data processing unit which outputs a sampling signal to trigger sampling of the transducer output by the current sampling unit. The current module also includes a current sensor memory 56 in which are stored characterization data for the current transducers comprising the module. The characterization data may include transducer identities; relevant specifications, such as turns ratio; and error correction factors, for example to correct for magnetization induced errors. The characterization data may also include the type of transducers, the number of transducers, the arrangement of transducers and the order of the transducers attachment to the respective sensor positions of the current module. At start up, the data processing unit queries the current sensor memory to obtain characterization data including error correction factors and relevant specifications that are used by the data processing unit in calculating the meter's output.

Figure 2:
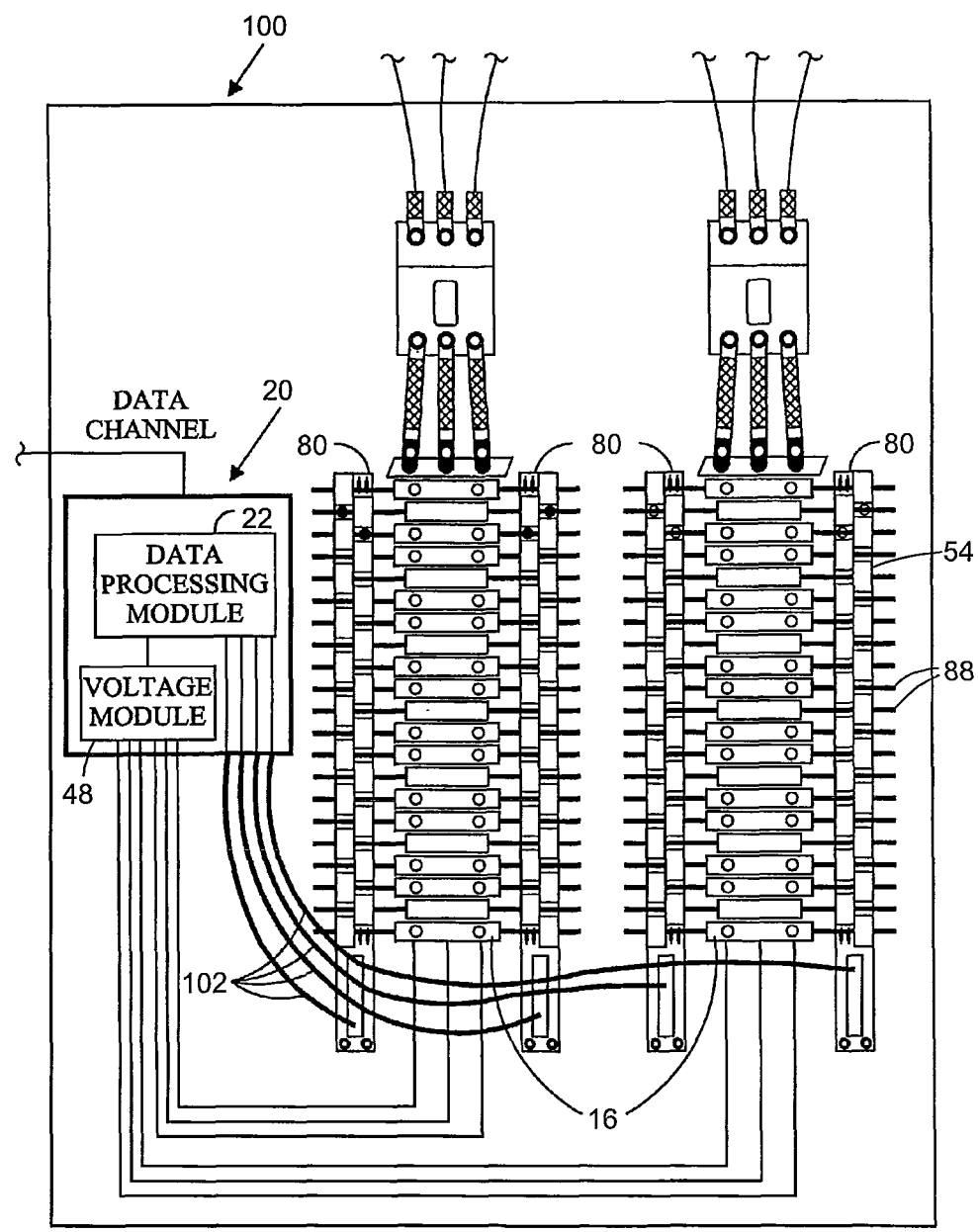
FIG. 2 illustrates circuit breakers, associated sensors and a power meter.
Figure 3:
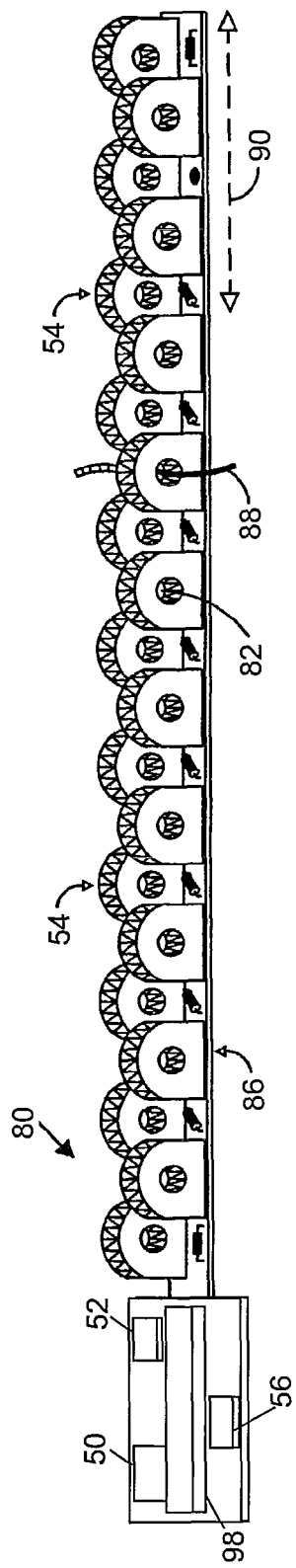
FIG. 3 is a perspective illustration of a plurality of sensors attached a common support.
Figure 4:
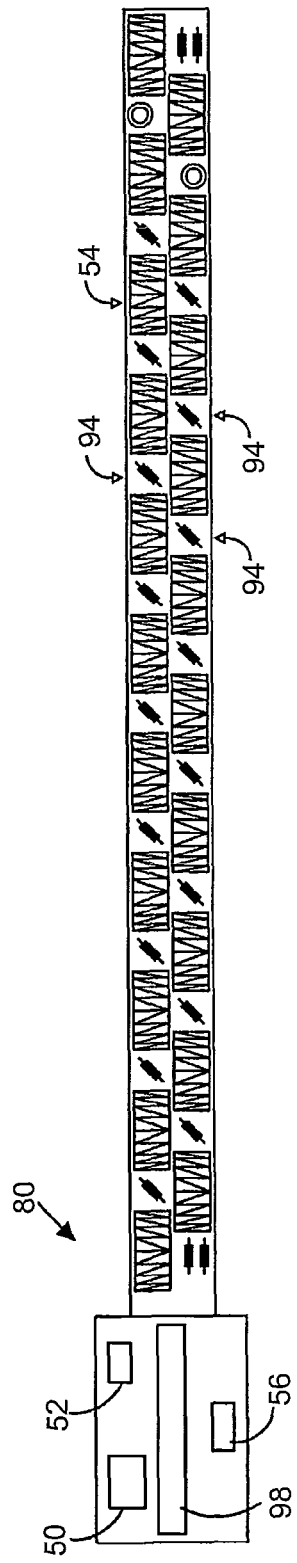
FIG. 4 is a top view of the plurality of sensors of FIG. 3.

Monitoring current in a plurality of branch circuits typically requires a plurality of current transducers, each one encircling one of the plurality of branch power cables that connect the distribution panel to the respective branch circuit. Current sensing may be performed by individual current sensors, such as the current transformer 54A, that are connected to the current module. Referring to FIGS. 2-4, on the other hand, a power meter may comprise one or more sensor strips 80 each comprising a plurality of current sensors attached to a common support, such as sensors 54A, 54B, 54C. The sensors 54 are preferably current transformers but other types of sensors may be used. Each current transformer comprises a coil of wire wound on the cross-section of a toroidal metallic or non-metallic core. The toroidal core is typically enclosed in a plastic housing that includes an aperture 82 enabling a power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the respective connections of the power cables 88 and their respective circuit breakers when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the transducer strip (current module) to the data processing module 22.

While strips of spatially fixed current transducers greatly facilitate installation of metering circuitry in power distribution panels, failure of an individual transducer typically requires replacement of the entire sensor strip because the coils of the transformers and the conductive traces that carry the signals from the transformers are encapsulated in insulating material and a damaged transducer can not be removed from the strip for replacement. In addition, current transformers are intended to operate within a specific current range and it is difficult to customize the strips of transducers for a particular application, that is, to provide a mix of transformers having, respectively, different operating ranges at particular locations on the strip to accommodate branch circuits that transmit substantially different magnitudes of current. The inventors concluded that the benefits of mounting current transformers in a strip could be extended if the current transformers making up the strip could be more readily interchanged.

Figure 5:
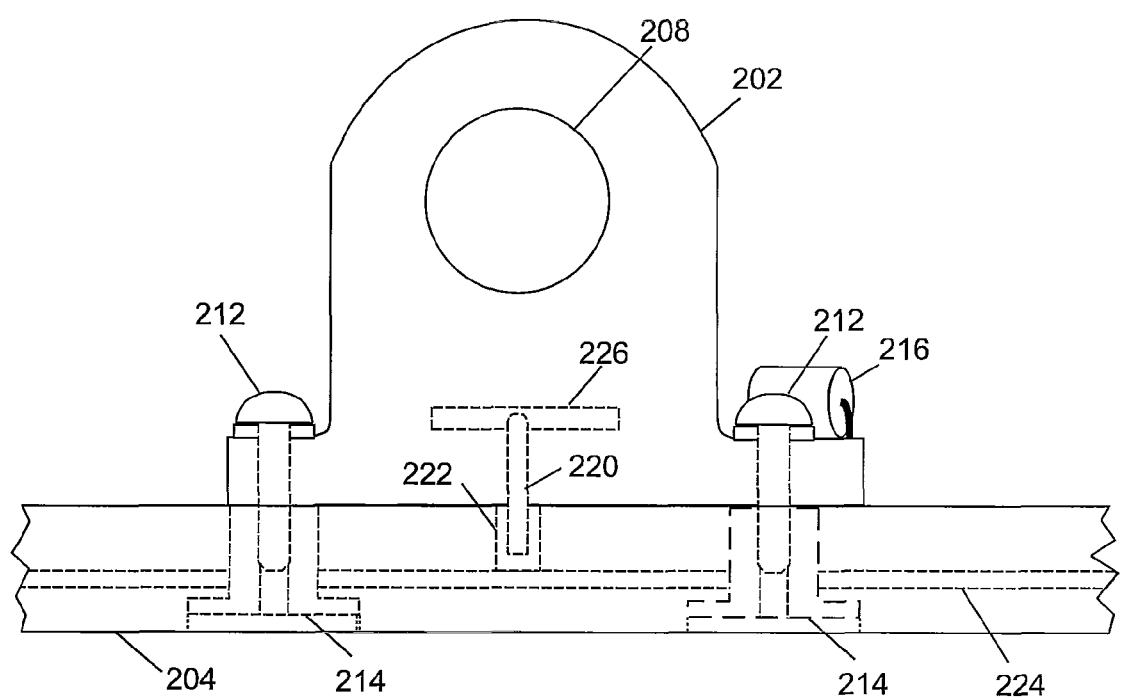
FIG. 5 is an elevation view of a current transformer detachably mounted on a support.
Figure 6:
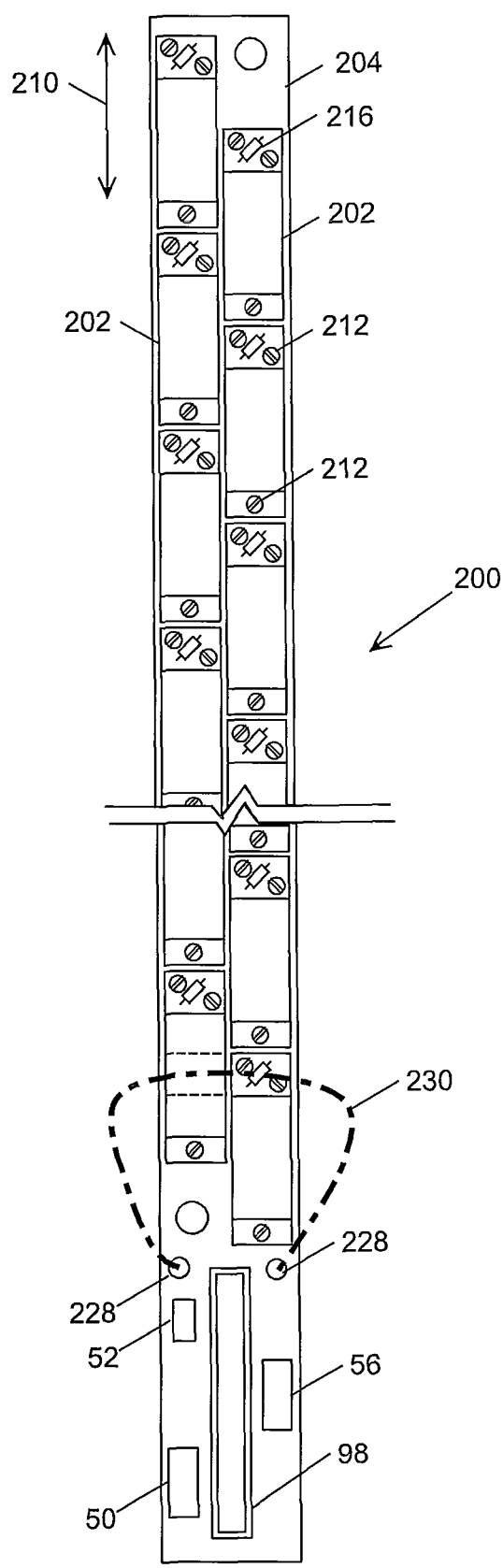
FIG. 6 is a top view of a current module including a plurality of detachably mounted current transformers.

Referring to FIGS. 5 and 6, the power meter may include one or more current modules comprising strips 200 of removable current transducers 202. A common support 204 maintains the current sensors in a fixed spatial relationship that preferably coincides with the locations of respective circuit breakers in a distribution panel to facilitate insertion of power cables into the apertures 208 of the current transformers. Preferably the support 204 is a rigid or semi-rigid dielectric, but a flexible support installed on a rigid or a semi-rigid supporting member(s) may likewise be used. The transformers are typically arranged in substantially parallel rows on the support and the housings of transformers in adjacent rows may be arranged to partially overlap in the direction of the longitudinal axis 210 of the support 204 to provide a more compact arrangement of sensors. The exemplary current transformers are attached to the support by screws 212 that engage threaded tee-nuts 214 embedded in the support but other types of fastening and latching elements could be used to secure the current transformers to the support.

The electrical interconnection of the current transformer may be accomplished through plugs 220 and sockets 222 that are conductively interconnected with the transformer's wiring and conductive traces 224 embedded in the insulating material of the support. The current sensor memory of the current module may comprise a current transformer memory 226 that is located within the housing of the individual current transformer and which may replace or, alternatively, supplement a current sensor memory 56 for the strip of current sensors. The characterization data may include transducer identities; relevant specifications, such as turns ratio; and error correction factors, for example to correct for magnetization induced errors. The characterization data may also include the type of transducers, the number of transducers, the arrangement of transducers and the order of the transducers attachment to the respective sensor positions of the current module. When the operation of the power meter is initiated, the data processing unit reads the transformer characterization data from the current transformer memory and uses the characterization data in calculating current, power and other electrical parameters related to the branch circuit monitored by the respective current transformer. A transducer strip can be customized with transformers having a variety of operating ranges by replacing individual detachable transformers in the strip. Since the transformer characterization data is stored in the transformer, the data processing module is provided with the appropriate characterization data for each of the individual transformers.

A transient voltage suppressor 216 may be connected in parallel across the output terminals of each transformer to limit the voltage build up when the terminals are open circuited, for example, when the transformer is removed from the support. In the event, the transformer fails or a transformer with different specifications is desired for a particular branch circuit, a new transformer may be installed by removing the appropriate transformer from the support and securing the new transformer in its place.

Figure 7:
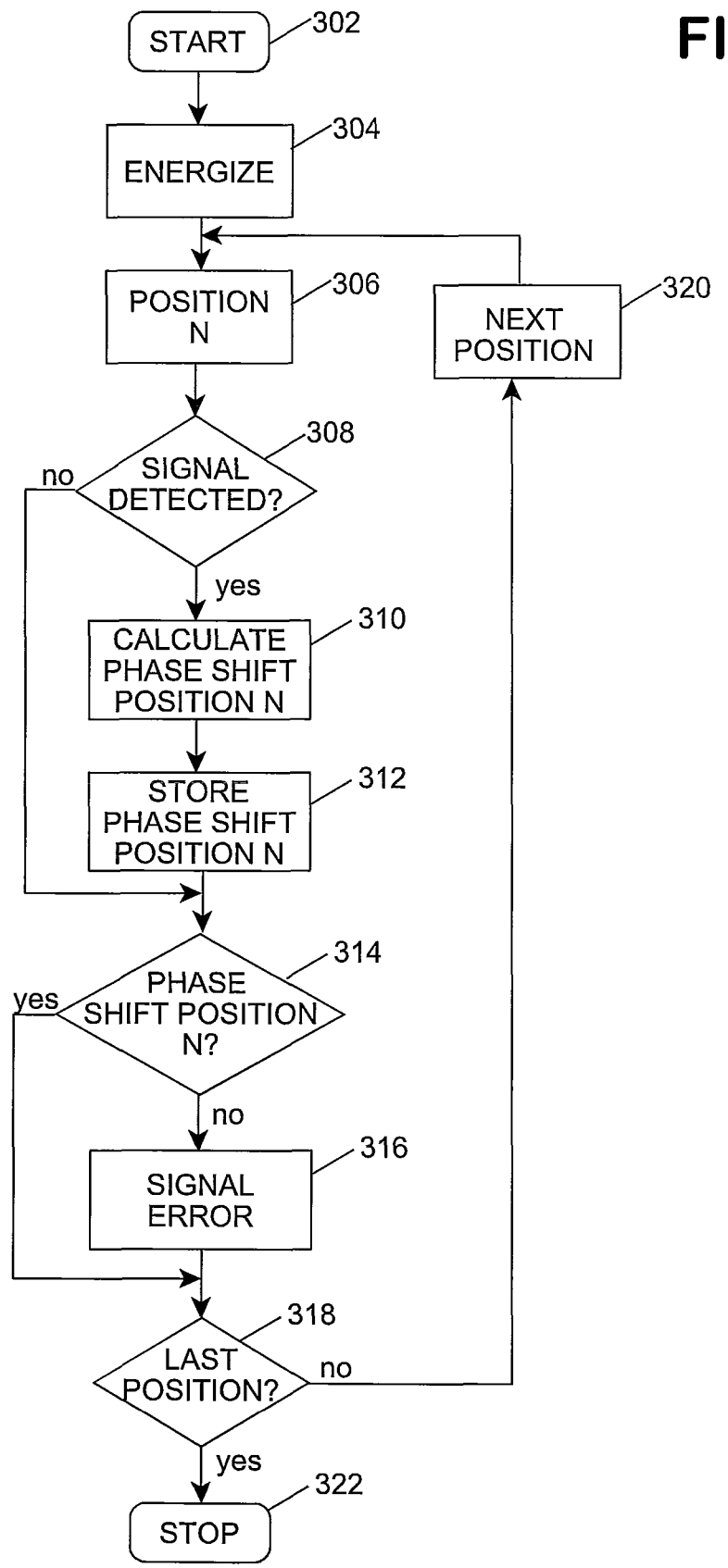
FIG. 7 is a flow diagram of a method for determining a phase shift of one of a plurality of current sensors.

When a new current transformer is installed in the current module the data processing unit may read the transformer characteristics that are stored in the sensor memory of the current module. On the other hand, the power meter 20 is arranged to discover the phase shift induced by the inductance of the respective current transformers. Referring to FIG. 6, the support 204 of the sensor strip includes traces that terminate in sockets 228 exposed on the upper surface of the support which a technician can connect with a jumper 230 that is extended through the aperture in one of the current transformers. Referring to FIG. 7, when initiated 302, typically by a command on a touch sensitive display 32, the data processing unit of the meter energizes the jumper 304 with a time varying signal, such as a pulse or a periodic waveform. The data processing unit connects to the secondary winding of the first transformer of the current module 304 and determines if the signal at the jumper has produced a corresponding quantitative change in the signal in the secondary winding 308. If a signal is detected, the data processing unit calculates the phase shift 310 by detecting the temporal difference between the occurrence of a reference point, such as a zero crossing or a pulse, in the secondary winding signal and the occurrence of the same point in the signal that is input to the jumper. The calculated phase shift is stored in an appropriate position in the current sensor memory or current transformer memory 312. The data processing unit checks the current sensor memory or the transformer memory for a stored value for a value for the phase shift, either the value that was stored following calculation or a previously stored value, for the respective sensor position 314. If no value is stored for the phase shift characteristic, the data processing unit signals an error 316 typically with a message on the display or an indicator light. If the data processing unit determines that a phase shift characteristic value is stored for the sensor position or if an error is signaled, the data processing unit determines if the sensor position is the last sensor position 318 of the current module. If the current sensor position is not the last sensor position of the current module, the data processing unit advances to the next position 320. If the current sensor position is the last sensor position of the current module, the process ends 322 with a phase shift characteristic mapped to each transformer position or with an error signaled to the technician who may move the jumper to another transformer position and restart the process 302 until a phase shift has been determined for all sensor positions.

Power from the utility is conducted to the bus bars of the facility's power distribution panel. Each of the circuit breakers that enable conduction to one or more of the facility's multiple loads is connected to one or more of the bus bars and conducts a single phase, two phases or three phases of power to the respective load. Each of the different loads connected to a bus bar has the same voltage potential and phase relationship and the power factor, which is a phase relationship between the voltage and current provided to a load, may be determined from the current that is conducted to the particular load and the voltage of the bus bar from which that current is drawn. The power consumed by any particular load can be determined from the voltage and its phase relationship sensed from the appropriate bus bar(s) and the current sensed from the respective power cable(s) supplying the load.

While installation of a power meter at the distribution panel has numerous advantages, the installation can be problematic. To properly connect the power meter, the installer is required to identify the phase of each of the bus bars of the distribution panel and the phase or phases supplied to each circuit breaker. However, there is little consistency in the manner of identifying the phase corresponding to the respective bus bars especially when the phase at each bus bar depends upon its interconnection to the power service from the utility. Similarly, the phase(s) carried by each circuit breaker may be difficult to identify because the connection to the bus bar(s) are typically hidden underneath the installed circuit breaker. To properly install the power meter, the installer needs to determine the phase for the respective bus bars, determine the phase for the circuit breaker associated with each branch circuit, identify the wire interconnecting the circuit breaker and the respective load, associate a particular sensor position with the interconnected wire, and interconnect the current sensor with the appropriate location of the power meter. The present inventors considered the likelihood of improper current sensor installation for branch power monitoring and concluded that the likelihood of correct installation would be improved if the power meter could self discover the phase(s) of the power associated with each current sensor interconnected with the power meter.

Figure 8:
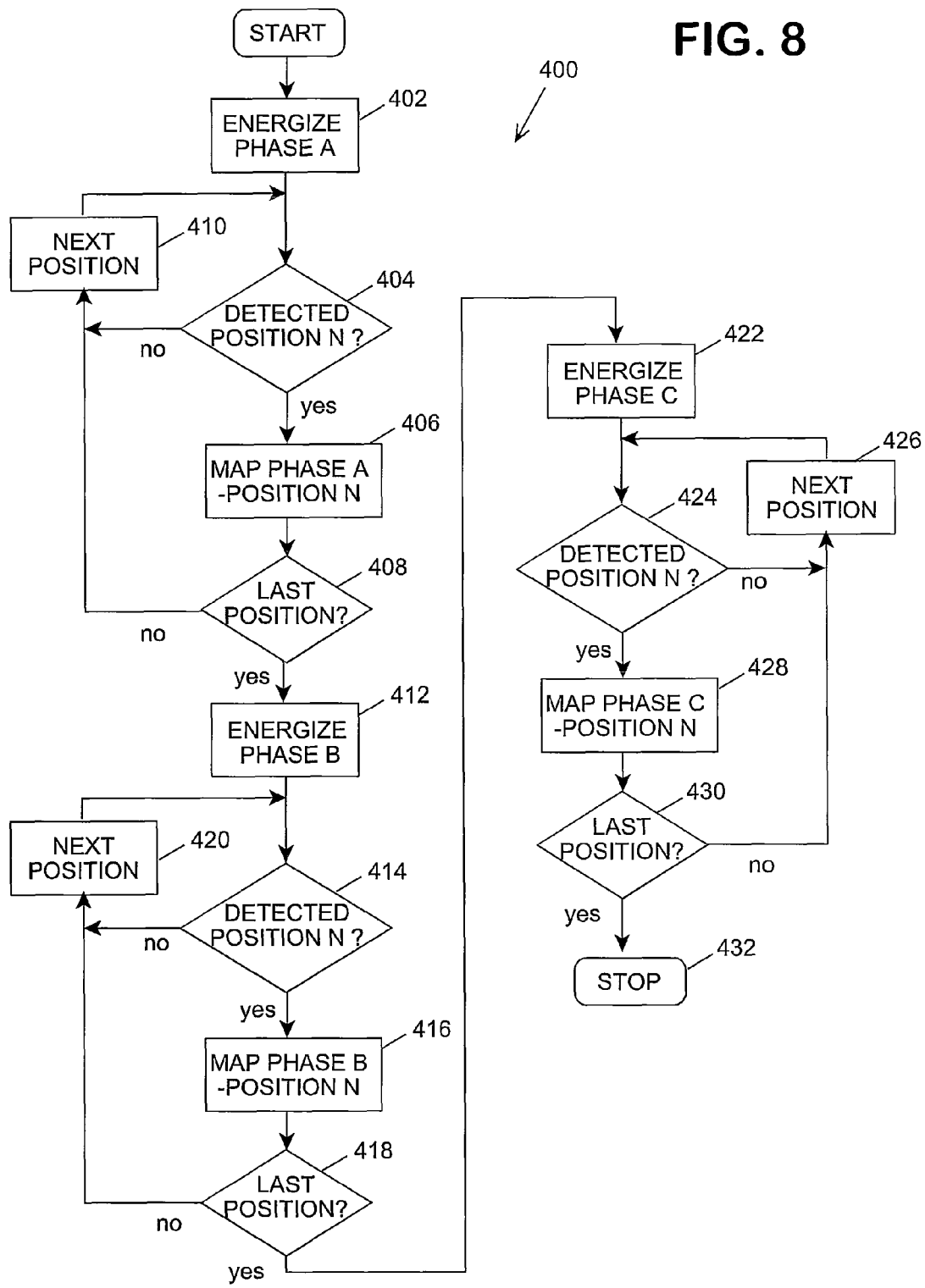
FIG. 8 is a flow diagram of a first method for determining a phase of power conducted by a branch circuit.

Referring to FIG. 8, in a first method of phase discovery 400, a signal is applied to a first bus bar 402, for example bus bar 23A. The data processing unit of the power meter is connected to the first current sensor position and, if the signal is detected 404, maps "phase A" to the first sensor position 406 by storing an identifier of phase A in the memory in conjunction with an identifier of the first sensor position. Following mapping to the first sensor position or if the signal was not detected at the first sensor position and if the current sensor position is not the last sensor position of the meter 408, the data processing unit connects to the next sensor position 410 and attempts to detect the signal at this position 404. Once the data processing unit has attempted to detect phase A for all of the sensor positions 408, a signal is applied to the second bus bar of the panel 412 and the data processing unit serially attempts to detect the signal for all of the sensor positions 414. If the signal is detected for any of the sensor positions, "phase B" is mapped to the memory for the respective sensor position 416. If the position being checked by the data processing unit is not the last sensor position 418 or if the signal is not detected at the position being checked 420, the data processing unit connects to the next position and the detection process is repeated for all current sensor positions. When all the sensor positions have been queried for phase B 418, the third bus bar (phase C) is energized 422. As with the first two bus bars, the data processing unit serially attempts to detect the signal 424 for each sensor position and maps "phase C" to the respective sensor positions at which the signal is detected. The data processing unit checks each sensor position 426 until all positions have been tested 430 and then terminates the phase discovery process 432.

Figure 9:
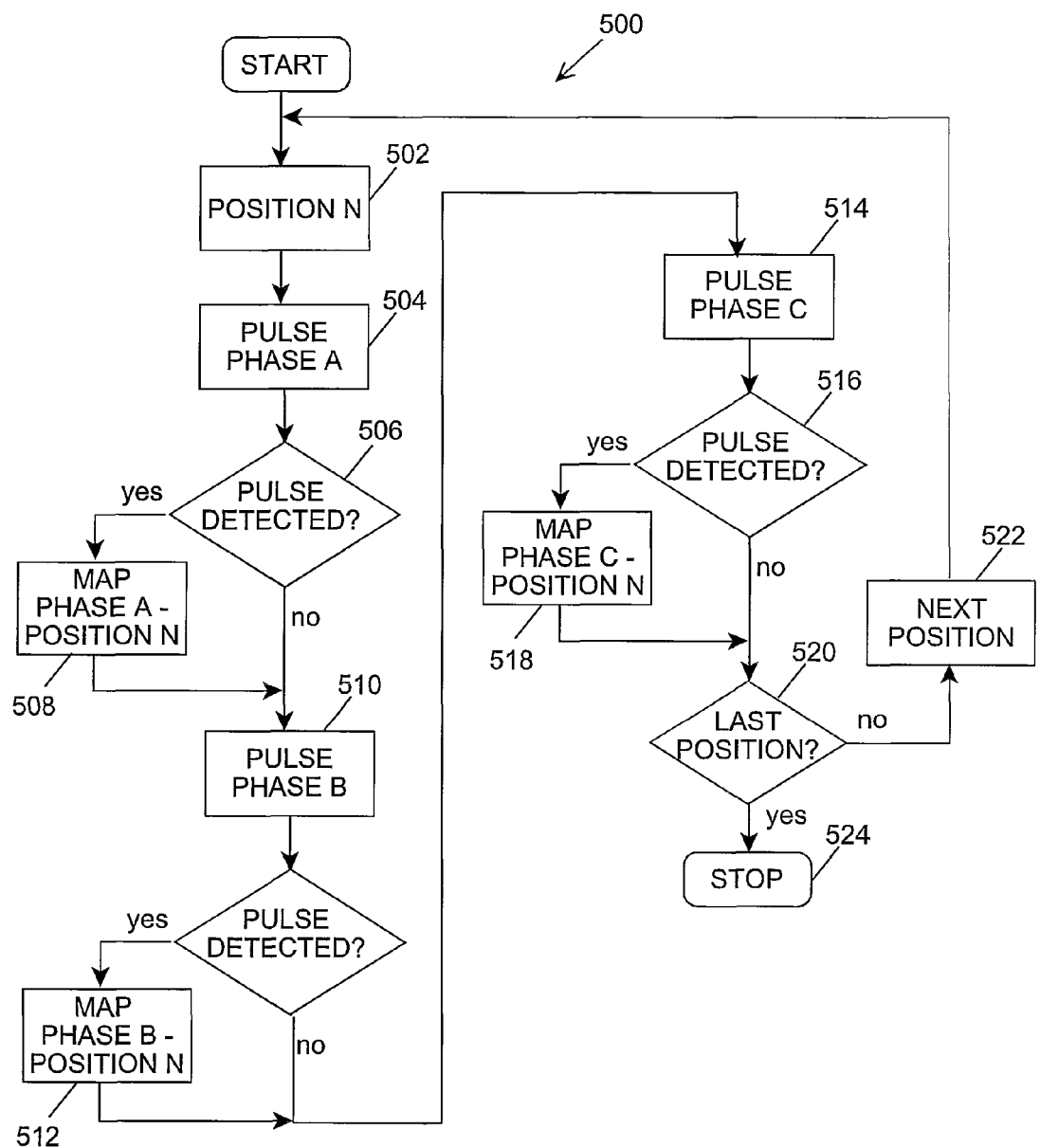
FIG. 9 is a flow diagram of a second method for determining a phase of power conducted by a branch circuit.

Referring to FIG. 9, in a similar phase discovery process 500, the data processing unit is conductively connected to the circuit breaker corresponding to the first current sensor position 502. A pulse or other signal is applied to the first bus bar 504 and if it is detected 506, phase A is mapped to the first sensor position 508. The signal is applied to the second bus bar 510 and if it is detected at the first sensor position, phase B is mapped to the first sensor position 512. Finally, the test signal is communicated to the third bus bar 514. If the data processing unit detects the signal at the first sensor position 516, phase C is mapped to the first current sensor position 518. If the current sensor position is not the last sensor position 520, the data processing unit connects to the next sensor position 522 and the process is repeated until the last sensor position has been checked 520 and the program ends 524.

Figure 10:
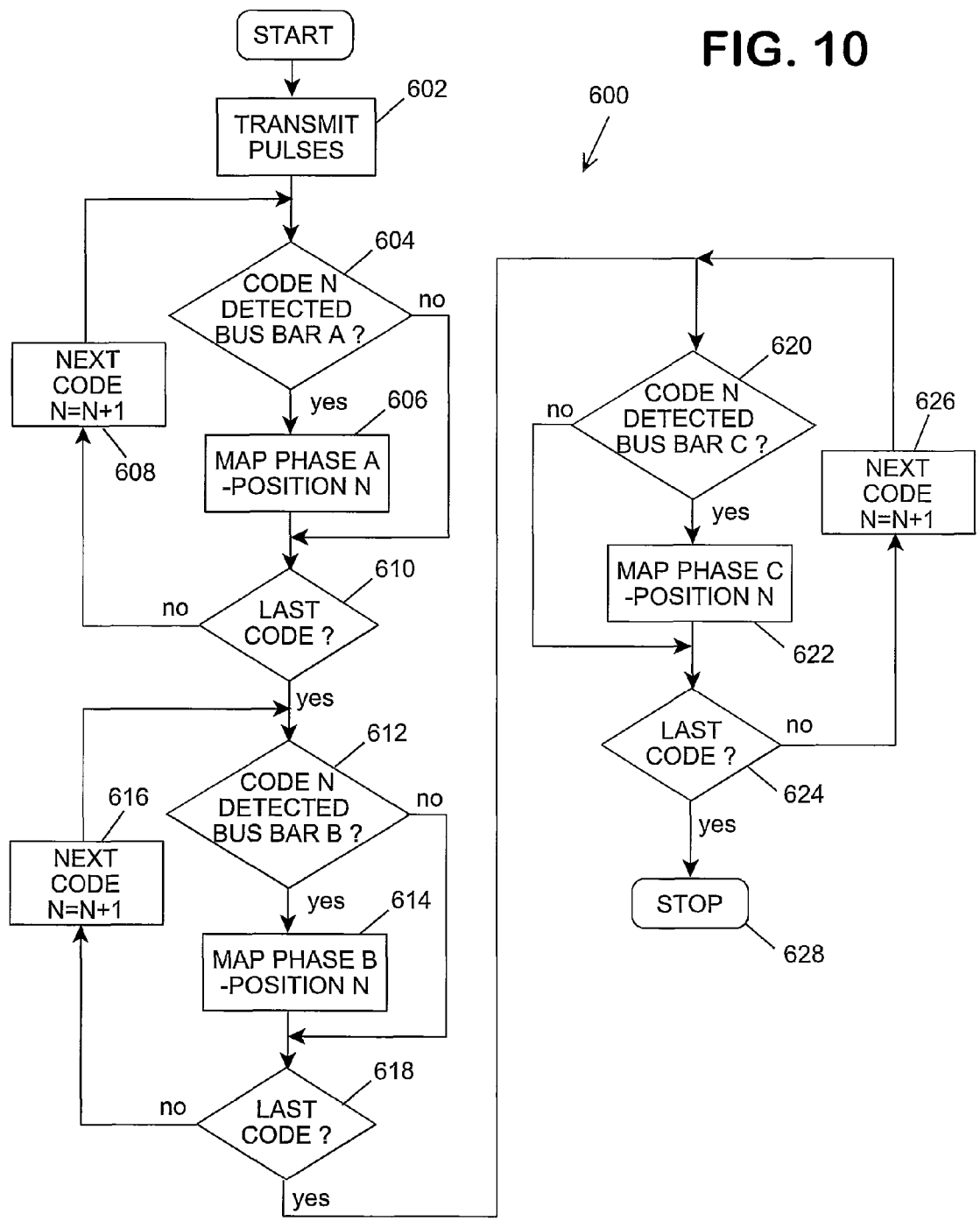
FIG. 10 is a flow diagram of a third method for determining a phase of power conducted by a branch circuit.

FIG. 10 illustrates still another method of phase discovery 600. In the third method of phase discovery, a coded signal is transmitted from each branch circuit connection at the distribution panel 602. The coded signal, for example a single pulse for the first sensor position; two pulses for the second sensor position, etc.; identifies the current sensor position corresponding to the branch circuit. If the data processing unit detects the coded signal identifying the first sensor position at the first bus bar 604, phase A is mapped to the first sensor position 606. The data processing unit serially attempts to detect each of the coded signals 608 until it has attempted to detect the code corresponding to the last sensor position 610. If the data processing unit has attempted to detect the code for the last sensor position 610 at the first bus bar, the data processing unit attempts to detect the code for the first sensor position at the second bus bar 612. When a code is detected at the second bus bar, phase B is mapped to the respective sensor position 614 and the data processing unit attempts to detect the next code 616 until it has attempted to detect all of the codes at the second bus bar 618. The process is repeated at the third bus bar 620 and phase C is mapped to any sensor position corresponding to a detected code 622. When all position codes have been tested for all bus bars 624, 626, the process terminates 628. The phase discovery methods enable determination of the number and identities of the phases of the power conducted in each branch circuit.

The power meter provides flexibility enabling customization during installation and repair of individual current sensor elements.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. An electricity meter comprising:
   (a) a current sensor having a sensor output datum quantitatively representing an electric current;
   (b) a current sensor memory affixed to said current sensor and arranged to store at least one current sensor characterization datum defining at least one of:

(i) a sensor type for said current sensor;
(ii) a magnetization error correction datum for said current sensor; and
(iii) a sensor position of said current sensor and a sensor position of at least one other sensor; and
(c) a data processing unit remote from said current sensor and said current sensor memory and including a selectively detachable conductive connection to said current sensor and said current sensor memory, said data processing unit arranged for communication with said current sensor and said current sensor memory and to calculate an electric current from said sensor output datum and at least one current sensor characterization datum.

2. The electrical meter of claim 1 where said current sensor comprises a current transformer.

3. The electrical meter of claim 1 wherein said current sensor comprises:
(a) a support arranged for detachable securement to a mounting surface; and
(b) a current transformer detachably connectable to said support.

4. The electrical meter of claim 1 wherein said current sensor comprises:
(a) a support arranged for detachable securement to a supporting structure; and
(b) a current transformer including a housing detachably connectable to said support, said housing enclosing said current sensor memory.

5. A meter comprising:
(a) a mounting structure arranged to support a plurality of current sensors and securable to a supporting structure;
(b) plural current sensors supported by said mounting structure, at least one current sensor detachably securable to said mounting structure and operable to output a sensor output datum quantitatively representing an electric current;
(c) a memory affixed to said at least one current sensor and arranged to store a current sensor characterization datum, said memory conductively connectable to a conductor supported by said mounting structure; and
(d) a data processing unit remote from said mounting structure, said at least one current sensor and said affixed memory and including a selectively detachable conductive connection to said at least one current sensor and said memory, said data processing unit arranged to communicate with said current sensor and said memory and to determine an electric current from said sensor output datum and said current sensor characterization datum.

6. The meter of claim 5 wherein said sensor characterization datum defines a sensor type of said current sensor.

7. The meter of claim 5 wherein meter further comprises a plurality of sensor positions, said sensor characterization datum defining a sensor position of said current sensor.

8. The meter of claim 5 wherein said sensor characterization datum defines a turns ratio of said current sensor.

9. The meter of claim 5 wherein said sensor characterization datum defines a phase shift of said current sensor.

10. A method for determining a shift between a phase of an electric current to be measured by one of a plurality of current transformers and a phase of an output signal of said current transformer, said method comprising the step of:
(a) passing a conductor through an aperture defined by portions of a toroidal core of one of said plural current transformers;
(b) energizing said conductor with a temporally varying signal;
(c) with a data processing device arranged to detect and compare said temporally varying signal and an output signal of respective ones of said plural current transformers determining if an output signal is detectable at one current transformer;
(d) if an output signal is detected at said one current transformer, measuring with said data processing device a temporal shift between a temporal reference in said temporally varying signal and a corresponding temporal reference in said output signal;
(e) in a memory accessible to said data processing device storing said temporal shift in association with an identification of said one current transformer; and
(f) if an output signal is not detected at said one current transformer repeating steps (c)-(f) for another current transformer; and
(h) if a temporal shift associated with said one current transformer has been stored in said memory, repeating steps (a)-(h) for another of said plural current transformers.

11. A method for determining a phase of electric power conducted by the ones of a plurality of branch circuit conductors, each branch circuit conductor connected to at least one source of electric power having one of a plurality of phases, said method comprising the steps of:
(a) installing a current sensor for each branch circuit conductor, each current sensor having an output quantitatively responsive to a current in said branch circuit conductor associated with said current sensor;
(b) energizing a first source of electric power with a temporally varying signal;
(c) with a data processing device arranged for selectively detecting an output by respective current sensors, determining if an output of a first current sensor quantitatively responds to said temporally varying signal;
(d) if said output of said first current sensor quantitatively responds to said temporally varying signal, storing an association of said first current sensor and a first phase of said electric power in a memory accessible by said data processing device;
(e) repeating steps (c) and (d) for each of said plurality of current sensors;
(f) removing said temporally varying signal from said first source of said electric power;
(g) energizing a second source of electric power with a temporally varying signal; and
(h) repeating steps (c) and (d) for each of said plurality of current sensors.

12. A method for determining a phase of electric power conducted by the ones of a plurality of branch circuit conductors, each branch circuit conductor connected to at least one source of electric power having one of a plurality of phases, said method comprising the steps of:
(a) energizing a first branch circuit conductor with a first signal;
(b) energizing a second branch circuit conductor with a second signal, said second signal distinguishable from said first signal;
(c) arranging a data processing device to detect a signal in a conductor arranged for conducting a first phase of electric power and a conductor arranged for conducting a second phase of electric power;
(d) if said first signal is detectable by said data processing device at said conductor arranged for conducting said first phase of electric power, storing an identification of said first phase in association with an identification of said first branch circuit conductor in a memory accessible by said data processing device;

(e) if said second signal is detectable by said data processing device at said conductor arranged for conducting said first phase of electric power, storing an identification of said first phase in association with an identification of said second branch circuit conductor in said memory accessible by said data processing device;

(f) if said first signal is detectable by said data processing device at said conductor arranged for conducting said second phase of electric power, storing an identification of said second phase in association with an identification of said first branch circuit conductor in said memory accessible by said data processing device; and (g) if said second signal is detectable by said data processing device at said conductor arranged for conducting said second phase of electric power, storing an identification of said second phase in association with an identification of said second branch circuit conductor in said memory accessible by said data processing device.

* * * * *